United States Patent
Vijaykumar

(10) Patent No.: US 9,401,679 B1
(45) Date of Patent: Jul. 26, 2016

(54) APPARATUS AND METHOD FOR IMPROVING POWER SUPPLY REJECTION RATIO

(71) Applicant: Analog Devices Global, Hamilton (BM)

(72) Inventor: Sharad Vijaykumar, Bangalore (IN)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/702,586

(22) Filed: May 1, 2015

(51) Int. Cl.
*H03F 3/45* (2006.01)
*H03F 1/14* (2006.01)
*H03F 3/21* (2006.01)

(52) U.S. Cl.
CPC .. *H03F 1/14* (2013.01); *H03F 3/21* (2013.01); *H03F 3/45273* (2013.01); *H03F 2200/18* (2013.01); *H03F 2203/45212* (2013.01)

(58) Field of Classification Search
None
See application file for complete search history.

(56) References Cited

U.S. PATENT DOCUMENTS

| 4,570,128 | A | | 2/1986 | Monticelli | |
|---|---|---|---|---|---|
| 5,180,932 | A | * | 1/1993 | Bengel | G11C 27/026 327/362 |
| 5,635,873 | A | * | 6/1997 | Thrower | H01L 23/5256 257/E23.15 |
| 5,736,900 | A | * | 4/1998 | Smith | H03F 1/34 330/265 |
| 6,040,732 | A | * | 3/2000 | Brokaw | H03F 3/72 327/408 |
| 6,762,646 | B1 | * | 7/2004 | Bell | H03F 3/45192 330/257 |
| 2014/0266840 | A1 | * | 9/2014 | Botker | H03F 1/14 341/155 |

OTHER PUBLICATIONS

Ahuja, Bhupendra K., "An Improved Frequency Compensation Technique for CMOS Operational Amplifiers," *IEEE Journal of Solid-State Circuits*, vol. SC-18, No. 16, pp. 629-633, Dec. 1983.

\* cited by examiner

*Primary Examiner* — Patricia T Nguyen

(74) *Attorney, Agent, or Firm* — Knobbe, Martens, Olson & Bear LLP

(57) ABSTRACT

A compensation capacitor can be added to an amplifier for stability. Disclosed are systems and methods for improving the power supply rejection ratio (PSRR) performance of an amplifier in the presence of one or more compensation capacitors.

20 Claims, 9 Drawing Sheets

APPARATUS AND METHOD FOR IMPROVING POWER SUPPLY REJECTION RATIO

BACKGROUND

1. Field

Embodiments of the invention relate to electronic systems, and more particularly, to improving power supply rejection ratio (PSRR) when utilizing Miller compensation for amplifiers.

2. Description of the Related Art

Miller compensation is commonly used to increase the stability of amplifiers. Additionally, in certain electronic systems, a high power supply rejection ratio (PSRR) is desirable. However, Miller compensation can lead to relatively poor PSRR at relatively high frequency. Specifically, high frequency power supply voltage variations, known as supply ripples, can appear at output of amplifiers which use Miller compensation.

SUMMARY

Each of the methods and devices of the described technology has several aspects, no single one of which is solely responsible for its desirable attributes.

One innovative aspect of the subject matter described in this disclosure can be implemented in an apparatus which can include: a first output transistor of an amplifier, wherein the first output transistor is electrically coupled to an output node; an amplifier compensation circuit which can include: a compensation capacitor and an isolating transistor, wherein: the compensation capacitor has a first end and a second end, wherein the first end is electrically coupled to the output node, wherein the second end is electrically coupled to a first node; a source and a drain of the isolating transistor are in a conductive path between the first node and a gate of the first output transistor; and a biasing transistor in series with the isolating transistor, wherein the biasing transistor is configured to bias the isolating transistor, wherein the biasing transistor is part of a current mirror load of a first stage of the amplifier; wherein the isolating transistor is biased by diverting a first current from the first stage of the amplifier and returning the first current to the first stage of the amplifier.

In another embodiment, the amplifier compensation circuit further includes a second compensation capacitor and a second isolating transistor, wherein: the second compensation capacitor has a first end and a second end, wherein the first end of the second compensation capacitor is electrically coupled to the output node, wherein the second end of the second compensation capacitor is electrically coupled to a second node; a source and a drain of the second isolating transistor are in a conductive path between the second node and a gate of a second output transistor; and a second biasing transistor in series with the second isolating transistor, wherein the second biasing transistor is configured to bias the second isolating transistor, wherein the second biasing transistor is part of a second current mirror load of the first stage of the amplifier; wherein the second isolating transistor is biased by diverting a second current from the first stage of the amplifier and returning the second current to the first stage of the amplifier.

Some embodiments can include a voltage source circuit configured to bias the gates of the first and second isolating transistors with a reference voltage that is substantially invariable to voltage fluctuations of a power supply of the amplifier.

In some embodiments, the biasing transistor is part of a current mirror load of the first stage of the amplifier such that a size ratio of the biasing transistor, a first transistor of the current mirror load and a second transistor of the current mirror load is about 2 to 3 to 5 respectively.

In some embodiments, the second biasing transistor is part of a second current mirror load of the first stage of the amplifier such that a size ratio of the second biasing transistor, a first transistor of the second current mirror load and a second transistor of the second current mirror load is about 2 to 3 to 5 respectively.

Some embodiments further include: first and second stability capacitors, wherein: the first stability capacitor has a first end and a second end, wherein the first end of the first stability capacitor is electrically coupled to the first node and the second end of the first stability capacitor is electrically coupled to a source of the first biasing transistor; and the second stability capacitor has a first end and a second end, wherein the first end of the second stability capacitor is electrically coupled to the second node and the second end of the second stability capacitor is electrically coupled to a source of the second biasing transistor.

In other embodiments, the disclosed apparatus can include: first and second stability capacitors, wherein: the first stability capacitor has a first end and a second end, wherein the first end of the first stability capacitor is electrically coupled to the first node and the second end of the first stability capacitor is electrically coupled to the gate of the first or the second output transistor; and the second stability capacitor has a first end and a second end, wherein the first end of the second stability capacitor is electrically coupled to the second node and the second end of the second stability capacitor is electrically coupled to the gate of the first or the second output transistor.

In some embodiments, the amplifier includes a class AB amplifier.

In some embodiments, the amplifier can include a class AB control circuit wherein: the control circuit can include a first control transistor and a second control transistor.

Another innovative aspect of the subject matter described in this disclosure can be implemented in a method of amplifier compensation which includes: electrically coupling a first output transistor of an amplifier, to an output node; electrically coupling a first end of a compensation capacitor to the output node, and electrically coupling a second end of the compensation capacitor to a first node; electrically coupling a source and a drain of an isolating transistor in a conductive path between the first node and a gate of the first output transistor; biasing the isolating transistor with a biasing transistor in series with the isolating transistor; mirroring a current from a current mirror load of a first stage of the amplifier to the biasing transistor; and diverting a first current from the first stage of the amplifier and returning the first current to the first stage of the amplifier.

In some embodiments, the method can further include: electrically coupling a first end of a second compensation capacitor to the output node, and electrically coupling a second end of the second compensation capacitor to a second node; electrically coupling a source and a drain of a second isolating transistor in a conductive path between the second node and a gate of a second output transistor; biasing the second isolating transistor with a second biasing transistor in series with the second isolating transistor; mirroring a second current from a second current mirror load of the first stage of the amplifier to the second biasing transistor; and diverting a second current from the first stage of the amplifier and returning the second current to the first stage of the amplifier.

In some embodiments, the method further includes: biasing, with a voltage source circuit, the gates of the first and second isolating transistors with a reference voltage that is substantially invariable to voltage fluctuations of a power supply of the amplifier.

In some embodiments, the biasing transistor is part of a current mirror load of the first stage of the amplifier such that a size ratio of the biasing transistor, a first transistor of the current mirror load and a second transistor of the current mirror load is about 2 to 3 to 5 respectively.

In some embodiments, the second biasing transistor is part of a second current mirror load of a first stage of the amplifier such that a size ratio of the second biasing transistor, a first transistor of the second current mirror load and a second transistor of the second current mirror load is about 2 to 3 to 5 respectively.

In some embodiments, the method can further include: providing first and second stability capacitors, electrically coupling a first end of the first stability capacitor to the first node, and electrically coupling a second end of the first stability capacitor to a source of the biasing transistor; and electrically coupling a first end of the second stability capacitor to the second node, and electrically coupling a second end of the second stability capacitor to a source of the second biasing transistor.

In other embodiments, the method can further include: proving first and second stability capacitors, electrically coupling a first end of the first stability capacitor to the first node, and electrically coupling a second end of the first stability capacitor to the gate of the first or the second output transistor; and electrically coupling a first end of the second stability capacitor to the second node, and electrically coupling a second end of the second stability capacitor to the gate of the first or the second output transistor.

In some embodiments of the method, the amplifier includes a class AB amplifier.

In some embodiments of the method, the amplifier further includes a class AB control circuit, wherein the control circuit comprises: a first control transistor and a second control transistor.

One innovative aspect of the subject matter described in this disclosure can be implemented in an apparatus which can include: means for outputting an output of an amplifier to an output node; means for compensation, wherein a first end of the compensation means is configured to be electrically coupled to the output node, and a second end of the compensation means is configured to be electrically coupled to a first node; means for isolating the output node, wherein the isolating means is in a conductive path between the first node and a gate terminal of the outputting means; means for biasing the isolating means, wherein the biasing means is in series with the isolating means; means for mirroring a first current to the biasing means; and means for diverting the first current from a first stage of the amplifier and returning the first current to the first stage of the amplifier.

In some embodiments, the apparatus can further include: second means for outputting the output of the amplifier to the output node; second means for compensation, wherein a first end of the second compensation means is configured to be electrically coupled to the output node, and a second end of the second compensation means is configured to be electrically coupled to a second node; second means for isolating the output node, wherein the second isolating means is in a conductive path between the second node and a gate terminal of the second outputting means; second means for biasing the second isolating means in series with the second isolating means; second means for mirroring a second current to the second biasing means; and means for diverting the second current from a first stage of the amplifier and returning the second current to the first stage of the amplifier.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

These drawings and the associated description herein are provided to illustrate specific embodiments of the described technology and are not intended to be limiting.

Like reference numbers and designations in the various drawings may indicate like elements.

DETAILED DESCRIPTION

Amplifier designers in some applications use pole splitting to improve the frequency response of amplifiers, increase stability and obtain good open loop gain performance. Miller compensation is usually used. This technique places one or more capacitors, known as Miller capacitors, in the feedback paths of the amplifier. However, a Miller capacitor can create a path for power supply ripple to appear at the output of the amplifier. The power supply ripple may be observable, for example in the form of voltage variations at the output of the amplifier.

Figure 1:
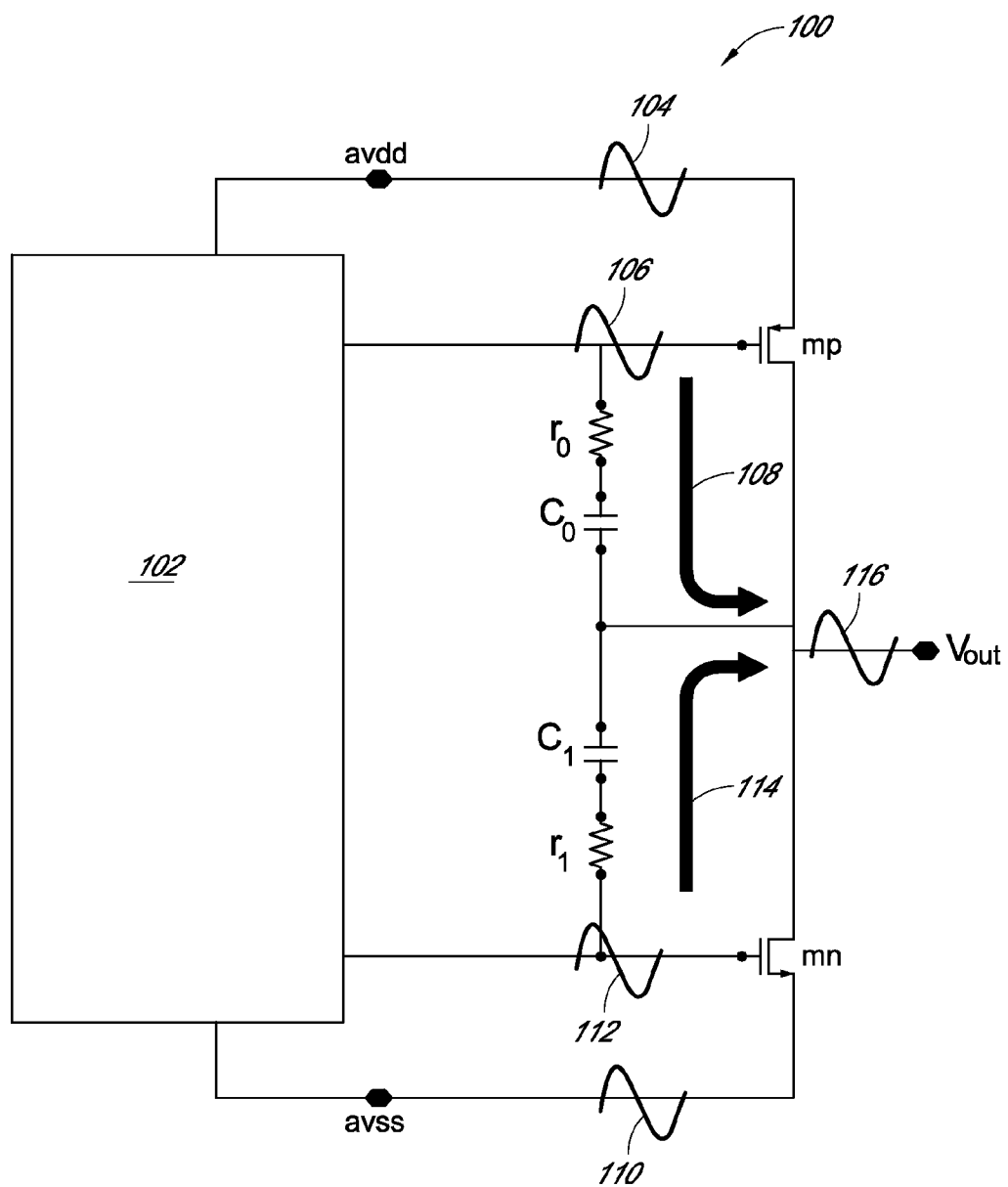
FIG. 1 illustrates a circuit diagram of an amplifier in which a Miller compensation technique for stability is used.

FIG. 1 is a circuit diagram illustrating an exemplary amplifier 100 in which two Miller capacitors $C_0$ and $C_1$ provide Miller frequency compensation. As shown, the amplifier 100 includes an amplifier first stage 102 and two transistor output stages mp and mn connected to an output node Vout of the amplifier 100. A PMOS transistor can be used to implement the output stage transistor mp, and an NMOS transistor can be used to implement the output stage transistor mn. The source of each of the output stage transistors mp and mn can be connected to a positive power supply rail avdd and a negative power supply rail ayss, respectively, as shown in FIG. 1. The drain of each of the output stage transistors mp and mn can both be connected to the output node Vout. The resistors $r_0$ and $r_1$ can be added between the output node Vout and the output transistors mp and mn, respectively in order to improve stability by shifting the right half s-plane zero in the Miller compensated amplifier 100 to the left half s-plane. The gate of each of the output stage transistors mp and mn can receive a signal or be connected to the amplifier first stage 102.

The Miller capacitors $C_0$ and $C_1$ are placed respectively in the feedback paths from the output node Vout to the gate of the transistor mp, and from the output Vout to the gate of the transistor mn. The power supply rails avdd and ayss provide power to the amplifier 100. FIG. 1 shows the positive power supply ripple 104 in the positive power supply rail avdd. When the transistor mp is operating in the saturation region (FET) or forward active region (BJT) and has a relatively large amount of transconductance, the gate to source voltage of the transistor mp is relatively constant. This can mean that if the source voltage of the transistor mp is changed because of the positive power supply ripple 104 at the positive power supply rail avdd, the gate of the transistor mp also changes by about the same amount.

The impedance of the Miller capacitor $C_0$ can be expressed approximately as $1/2\pi f \cdot j \cdot C_0$ where f is the frequency of the signal seen by the Miller capacitor $C_0$ and j is the imaginary unit. As frequency f increases, the impedance of the Miller capacitor $C_0$ decreases and the Miller capacitor $C_0$ more closely resembles a short circuit. The noise 106 due to the positive power supply ripple 104 can be transferred via the path 108 and seen at the output Vout as output ripple 116.

Similarly, the negative power supply ripple 110 on the negative power supply rail ayss is seen as the voltage variations 112 at the Miller capacitor $C_1$. At high frequencies, the voltage variations 112 are transferred via the path 114 to the output Vout contributing to the undesirable output ripple 116.

A figure of merit for amplifiers is power supply rejection ratio (PSRR), which characterizes how well an amplifier suppresses variations in its power supply voltage from appearing at its output. As described above, the presence of Miller capacitors $C_0$, $C_1$ can cause power supply ripple to appear at the output Vout; hence degrading the amplifier's PSRR performance at high frequencies.

Figure 2:
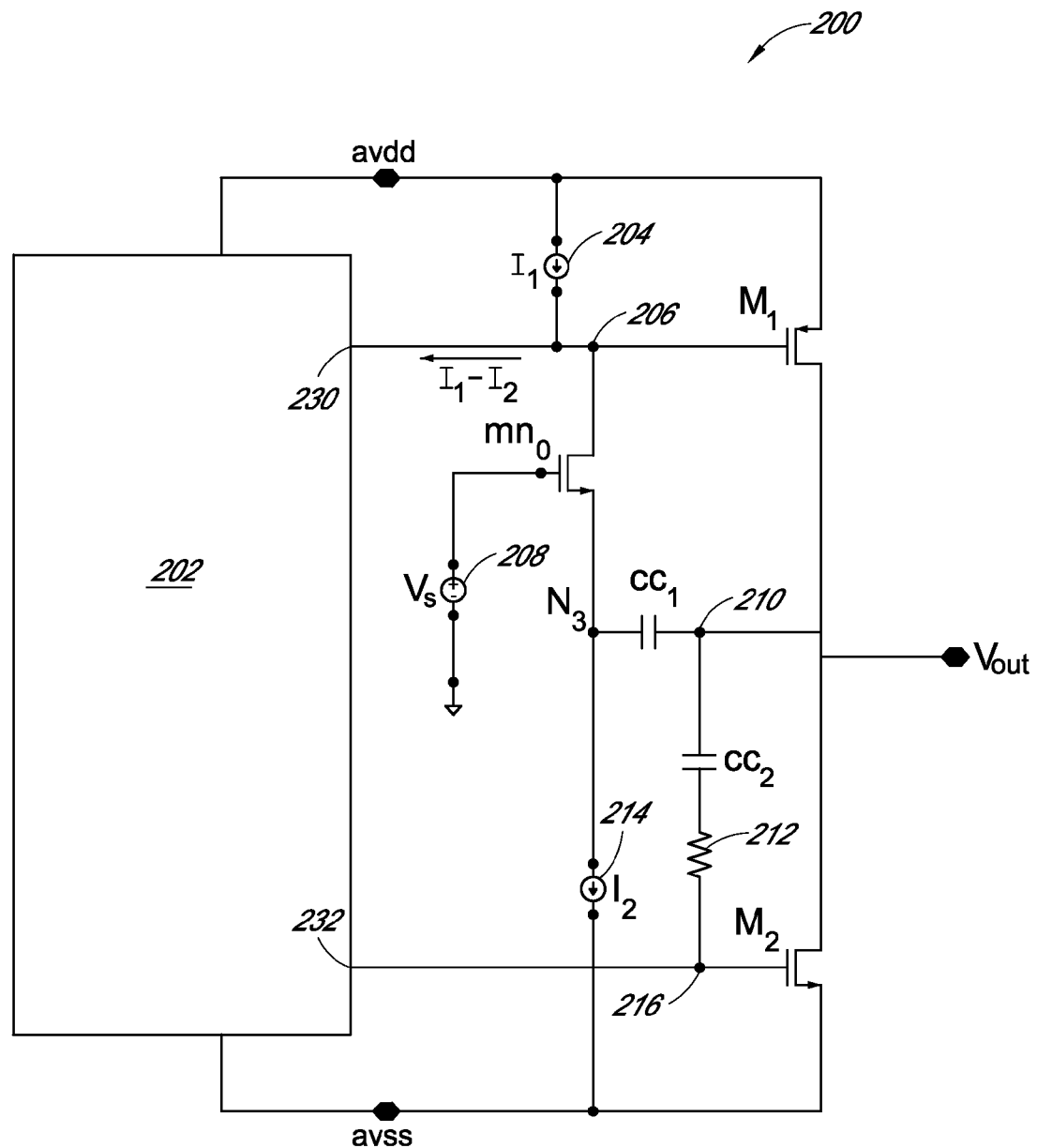
FIG. 2 illustrates a circuit diagram in which Miller compensation is used in conjunction with a technique to improve PSRR.

FIG. 2 is a schematic illustrating an example of an amplifier 200 in which Miller compensation is used between an amplifier first stage 202 and output stage transistors $M_1$ and $M_2$ to improve stability. The amplifier first stage 202 can correspond to amplifier stages typical of operational amplifiers and the like, and can include circuits such as differential circuits, biasing circuits, and the like. As shown in FIG. 2, one solution is to connect a Miller capacitor $CC_1$ to a low impedance node $N_3$ that is biased to a relatively stable voltage with respect to a ground potential even when the power supply rails avdd and ayss experience voltage variations.

A PMOS transistor can be used to implement the output stage transistor $M_1$, and an NMOS transistor can be used to implement the output stage transistor $M_2$. The source of each of the output stage transistors $M_1$ and $M_2$ can be connected to a positive power supply rail avdd and a negative power supply rail ayss, respectively, as shown in FIG. 2. The drain of each of the output stage transistors $M_1$ and $M_2$ can both be connected to the output node Vout. The gates of each of the output stage transistors $M_1$ and $M_2$ can be connected to the amplifier first stage 202 through the nodes 206 and 216 respectively.

The Miller capacitor $CC_1$ is arranged in a manner to the Miller capacitor $CC_1$ from the ripple of the positive power supply rail avdd. A second Miller capacitor $CC_2$ can also be used to provide Miller compensation from the node 216 to the output Vout. For example, the second Miller capacitor $CC_2$ can be connected between a node 210 (or the output node Vout) in series with a resistor 212 to the gate of the output stage transistor $M_2$ at node 216. While not shown in FIG. 2, the second Miller capacitor $CC_2$ can also be arranged in a manner similar to the Miller capacitor $CC_1$ to isolate it from negative power supply ripple.

To generate a relatively low impedance for the node $N_3$, a transistor $mn_0$ can be arranged between the gate (node 206) of the output stage transistor $M_1$ and an electrode of the Miller capacitor $CC_1$. The transistor $mn_0$ can be implemented using a FET or bipolar transistor or other devices. In the exemplary amplifier 200 of FIG. 2, an NMOS is used to implement the transistor $mn_0$. The gate of the transistor $mn_0$ is biased with a voltage source 208 having a voltage Vs which is biased with respect to ground. Current sources 204 and 214 can be used to bias the transistor $mn_0$. These current sources may themselves correspond to current mirrors and include additional circuit elements such as transistors. In this arrangement, the current sources 204 and 214 force a nearly constant current through the transistor $mn_0$. Even when the drain voltage of the transistor $mn_0$ (node 206) is subjected to ripple from the positive power supply rail avdd, the gate and the gate to source voltage, and consequently, the source voltage of the transistor $mn_0$ remains relatively constant in order to maintain a constant current through the transistor $mn_0$. Node $N_3$ can therefore be relatively stable even when there is voltage fluctuation in the positive power supply rail avdd.

There can be, however, drawbacks to the solution described above. For example, while the current sources 204 and 214 are designed to be identical, process mismatches and manufacturing non-idealities can cause these current sources to generate unequal currents $I_1$ and $I_2$ respectively. In this scenario, the difference between the currents $I_1$ and $I_2$ can flow in the amplifier first stage 202, from the node 206 causing an offset in the amplifier first stage 202 of the amplifier 200. Additionally, the two current sources 204 and 214 and their associated current mirrors and devices can contribute to an increase in thermal noise in the amplifier 200. Finally, the additional current sources 204 and 214 and their associated circuitry can increase the power consumption of the amplifier 200.

Figure 3:
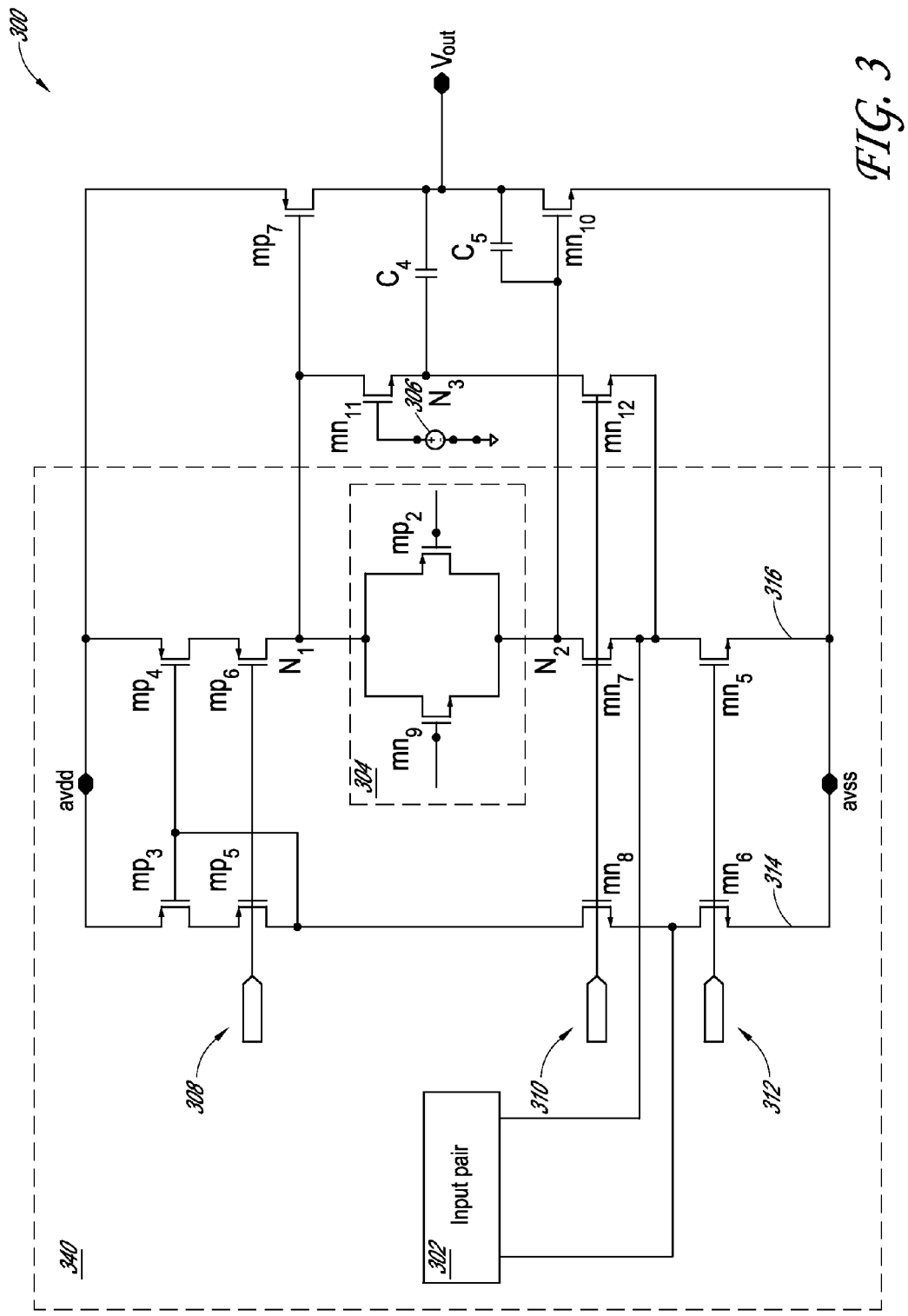
FIG. 3 illustrates a circuit diagram of an amplifier in which a frequency compensation technique and apparatus according to an embodiment are used.

FIG. 3 shows a circuit diagram illustrating an example of an amplifier 300 with a class AB output stage and a frequency compensation technique. The output stage of the amplifier 300 can include a first output transistor $mp_7$ and a second output transistor $mn_{10}$ connected in series to an output node Vout. The first output transistor $mp_7$ can be implemented with a PMOS transistor. The second output transistor $mn_{10}$ can be implemented with an NMOS transistor. Bipolar or other devices can alternatively be used.

The amplifier 300 can further include an amplifier first stage 340. The amplifier first stage 340 can further include an input pair 302. The input pair 302 can include for example a differential pair accepting single or differential input. The input pair 302 can generate differential outputs to branches 314 and 316 of a folded cascode arrangement of the transistors $mn_5$, $mn_6$, $mn_7$, and $mn_8$. The transistors $mp_3$, $mp_4$, $mp_5$, $mp_6$ form current mirror loads of the first stage 340 of the amplifier 300. The biasing circuits 308, 310 and 312 can provide biasing voltage for various parts of the amplifier 300. These biasing circuits may be implemented as part of the amplifier first stage 340 or elsewhere through use of current mirrors, voltage references or other biasing techniques.

The transistors $mp_3$, $mp_4$, $mp_5$, $mp_6$ can be implemented using PMOS transistors. The transistors $mn_5$, $mn_6$, $mn_7$, and $mn_8$ can be implemented using NMOS transistors. Bipolar or other devices can alternatively be used. The positive power supply rail avdd and the negative power supply rail ayss provide power to the amplifier 300. The source of each of the transistors $mp_3$ and $mp_4$ can be connected to the positive power supply rail avdd. The source of the transistor $mp_5$ can be connected to the drain of the transistor $mp_3$. The source of the transistor $mp_6$ can be connected to the drain of the transistor $mp_4$. The gates of the transistors $mp_3$ and $mp_4$ can be connected to each other and can also be connected to the drain of the transistor $mp_5$. The biasing circuit 308 can provide a biasing voltage for the gates of each of the transistors $mp_5$ and $mp_6$. The drain of the transistor MP6 can be connected through the node $N_1$ to a control stage 304.

The control stage 304 can provide output control for the output stage transistors $mp_7$ and $mn_{10}$ where the gates of the output transistors $mp_7$ and $mn_{10}$ can be connected to the Nodes $N_1$ and $N_2$ respectively. The control stage 304 can include an NNOS transistor $mn_9$ and a PMOS transistor $mp_2$. Bipolar or other similar devices can also be used. The source of the transistor $mp_2$ and the drain of the transistor $mn_9$ can each be connected to the node $N_1$ of the amplifier first stage 340. The drain of the transistor $mp_2$ and the source of the transistor $mn_9$ can each be connected to the node $N_2$ of the amplifier first stage 340. The drain of the transistor $mn_7$ can be connected to the control stage 304 via the node $N_2$. In one example, the control stage 304 can be implemented by a MOS version of a Monticelli cell, which is described in U.S. Pat. No. 4,570,128 to Monticelli, the disclosure of which is hereby incorporated by reference herein. The control stage 304 controls the voltages at the nodes $N_1$, $N_2$ for class AB control.

The source of each of the transistors $mn_5$ and $mn_6$ can be connected to the negative power supply rail ayss. The gates of these two transistors can each be biased with a reference voltage provided by the biasing circuit 312. The source of the transistor $mn_7$ can be connected to the drain of the transistor $mn_5$. The source of the transistor $mn_8$ can be connected to the drain of the transistor $mn_6$. The gates of the transistors $mn_7$ and $mn_8$ can each be biased with a voltage reference provided by the biasing circuit 310.

The amplifier 300 can include compensation circuitry according to an embodiment to reduce or avoid the shortcomings of using Miller compensation in the circuit arrangement described earlier with reference to FIG. 2, particularly when the amplifier 300 operates in high frequency regions. The compensation circuitry can include, for example, a compensation capacitor C4 and an isolating transistor $mn_{11}$. The isolating transistor $mn_{11}$ can be implemented in some embodiments with an NMOS transistor. Bipolar or other devices can alternatively be used. The isolating transistor $mn_{11}$ can be used to provide the node $N_3$ with similar properties as was described with reference to the amplifier 200 of FIG. 2. The isolating transistor $mn_{11}$ can be arranged such that its gate can be biased with a bias source 306 with respect to a ground potential. The source of the isolating transistor $mn_{11}$ can be connected to the compensation capacitor $C_4$ via the node $N_3$. The drain of the isolating transistor $mn_{11}$ can be connected to the gate of the first output transistor $mp_7$. The biasing current for the isolating transistor $mn_{11}$ can be provided by a biasing transistor $mn_{12}$. The gate of the biasing transistor $mn_{12}$ can be biased with a voltage reference provided by the biasing circuit 310. The biasing transistor $mn_{12}$ can be implemented with an NMOS transistor in some embodiments. Bipolar or other devices can alternatively be used. In this arrangement, the biasing transistor $mn_{12}$ can be in series with the isolating transistor $mn_{11}$, and the biasing transistor $mn_{12}$ can be part of a current mirror load of the first stage 340 of the amplifier 300 and biased with the biasing circuit 310 and the transistors $mn_7$ and $mn_8$.

As supply variations and ripple appear at the positive power supply rail avdd, the current through the transistor $mn_{11}$ is approximately the same; hence, the gate to source voltage of the transistor $mn_{11}$ is relatively fixed. Therefore, the node $N_3$ can remain at approximately the same voltage even when the voltage of the positive power supply rail varies due to ripple.

Advantageously, the embodiment illustrated in FIG. 3, unlike the solution shown in FIG. 2, can avoid using the extra current sources 204 and 214. The biasing current for the transistor $mn_{11}$ can be obtained by diverting a current from the amplifier first stage 340 through the node $N_1$ where the same current is then returned to the amplifier first stage 340 via the drain of the biasing transistor $mn_{12}$. In this manner, the need for the current sources 204 and 214 can be obviated. No external current due to the mismatch of these current sources is injected to the amplifier first stage 340. Therefore, no undesirable offset due to the compensation circuity of FIG. 3 is introduced to the amplifier first stage 340. An increase in thermal noise and power consumption can also be avoided.

The amplifier 300 also can include a second compensation capacitor $C_5$ arranged between the gate of the second output transistor $mn_{10}$ and the output node Vout. The second compensation capacitor $C_5$ can also provide Miller compensation. However, in the circuit diagram as shown, a negative power supply ripple at high frequencies can appear at the output node Vout through the second compensation capacitor $C_5$. The embodiment described in relation to FIG. 4 can provide a circuit configuration such that the second compensation capacitor $C_5$ can be arranged in a manner similar to the compensation capacitor $C_4$ thereby preventing or reducing the pass-through of the negative power supply ripple, if any. Of course, in some amplifiers, the negative power supply rail ayss can be ground instead of a negative voltage and can be without ripple. As will be described in relation to FIG. 4, introducing additional current sources into the amplifier 400 can also be avoided.

Figure 4:
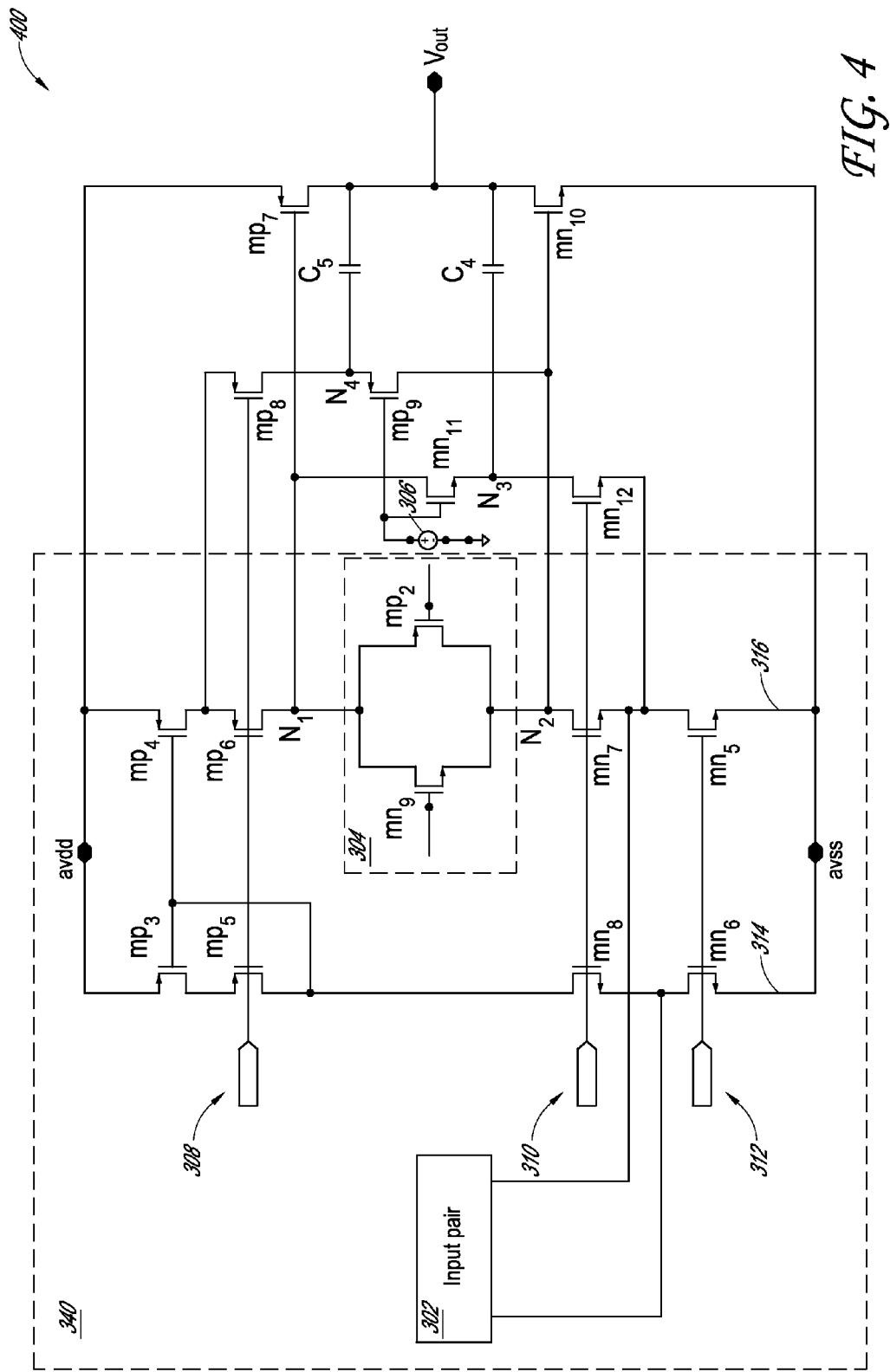
FIG. 4 illustrates a circuit diagram of another amplifier in which a frequency compensation technique and apparatus according to an embodiment are used.

FIG. 4 shows a circuit diagram of an amplifier 400 with a class AB output stage where a frequency compensation technique and apparatus according to an embodiment are used. To avoid repetition of description, components having the same or similar function may be referenced by the same reference number. The amplifier 400 includes compensation circuitry to improve power supply rejection ratio (PSRR) of the amplifier 400 both from the positive power supply rail avdd and negative power supply rail ayss.

In the amplifier 400, the second compensation capacitor $C_5$ can be arranged such that its electrodes are connected between the output node Vout and the node $N_4$, which is similar to the node $N_3$ and does not substantially change voltage when the voltage of the negative power supply rail ayss fluctuates due to ripple. A second isolating transistor $mp_9$ can help accomplish this. The second isolating transistor $mp_9$ can be implemented in some embodiments with a PMOS transistor. Bipolar or other devices can alternatively be used. The gate of the second isolating transistor $mp_9$ is connected between the bias supply 306 which is a reference voltage biased with respect to ground. The source of the second isolating transistor $mp_9$ can be connected to an electrode of the second compensation capacitor $C_5$ via the node $N_4$. The drain of the second isolating transistor $mp_9$ can be connected to the gate of the second output transistor $mn_{10}$. The biasing current for the second isolating transistor $mp_9$ can be provided by a second biasing transistor $mp_8$, by diverting a current from the amplifier first stage 340 and returning the same current to the amplifier first stage. The second biasing transistor $mp_8$ can be implemented with a PMOS transistor in some embodiments. Bipolar or other devices can alternatively be used. In this arrangement, the second biasing transistor $mp_8$ can be in series with the second isolating transistor $mp_9$, and the second biasing transistor $mp_8$ can be part of a current mirror load of the amplifier first stage 340 of the amplifier 400 and biased with the biasing circuit 308 and the transistors $mp_5$ and $mp_6$.

As supply variations and ripple appear at the negative power supply rail ayss, the current through the transistor $mp_9$ is approximately the same; hence the gate to source voltage of the transistor $mp_9$ is relatively fixed. Therefore, the node $N_4$ can remain at approximately the same voltage even when the voltage of the negative power supply rail varies due to ripple.

Therefore, same or similar advantages as outlined above with respect to FIG. 3 can be realized in the amplifier 400 of FIG. 4. In addition, same or similar advantages and better PSRR performance can be realized for both positive and negative power supply rails avdd and ayss.

The sizing of the biasing transistors $mp_8$ and $mn_{12}$ and their respective current mirror transistors $mp_5$, $mp_6$, $mn_7$ and $mn_8$ can be selected for a variety of factors, such as slew rate. For example, in some embodiments the ratio of the sizes of the biasing transistor $mn_{12}$ and the current mirror load transistors $mn_7$ and $mn_8$ can be about 2 to 3 to 5 respectively. Similarly, in some embodiments, the ratio of the sizes of the second biasing transistor $mp_8$ and the current mirror load transistors $mp_6$ and $mp_5$ can be about 2 to 3 to 5, respectively. Other applicable ratios will be readily determined by one of ordinary skill in the art.

Figure 5:
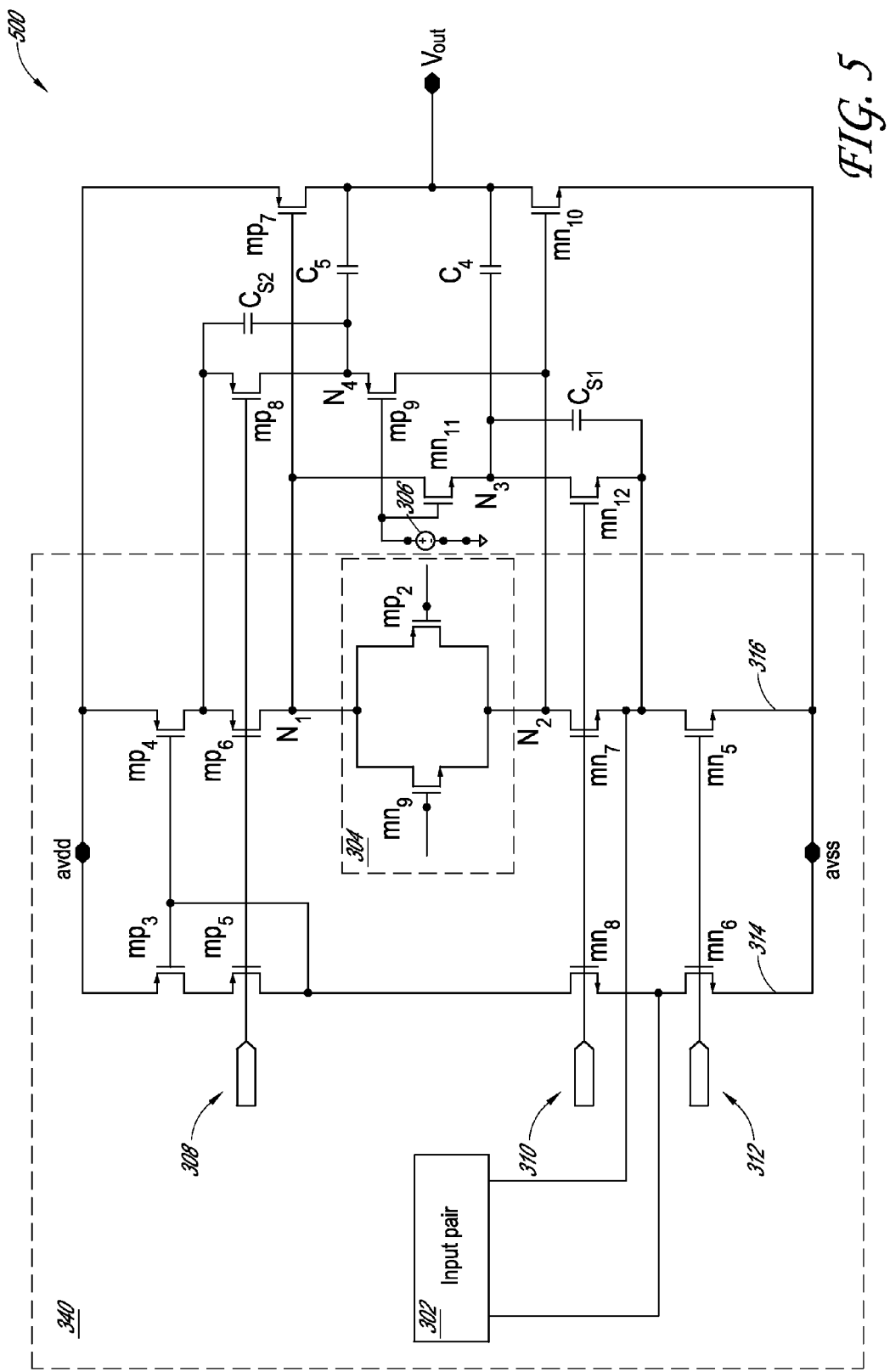
FIG. 5 illustrates a circuit diagram of the amplifier of FIG. 4 in which stability capacitors are used according to an embodiment.

FIG. 5 shows a circuit diagram of an amplifier 500 in which a class AB output stage and a frequency compensation technique according to an embodiment are used. To avoid repetition of description, components having the same or similar function may be referenced by the same reference number. Additionally, the amplifier 500 can optionally include stability capacitors $C_{s1}$ and $C_{s2}$. In some embodiments, having a compensation circuitry for both positive and negative supply rails avdd and ayss can create an undesirable peak in the gain response of the amplifier 400 of FIG. 4. Such peaking can cause ringing for some manufacturing and load conditions. To prevent or reduce undesirable peaking in gain, one or two bypass or stability capacitors $C_{s1}$ and $C_{s2}$ can be used. In some embodiments, the stability capacitors $C_{s1}$ and $C_{s2}$ can each have a capacitance ⅛th that of the capacitance of the compensation capacitors $C_4$ and $C_5$ respectively. However, applicable values for the stability capacitors $C_{s1}$, $C_{s2}$ can depend on the circuit implementation and other applicable values will be readily determined by one of ordinary skill in the art. At high frequencies, these stability capacitors $C_{s1}$ and $C_{s2}$ can bypass the biasing transistors $mn_{12}$ and $mp_8$, respectively. In one embodiment, one end of each of the stability capacitors $C_{s1}$, $C_{s2}$ is directly connected to an end of the compensation capacitors $C_4$, $C_5$. The stability capacitors Cs1 and Cs2 provide an alternative path for a signal to the output node Vout, bypassing the transistors mp8, mp9, mn11 and mn12. This can reduce undesirable peaking by reducing the gain of the amplifier at high frequencies.

The arrangement of the stability capacitors $C_{s1}$ and $C_{s2}$ is not limited to the embodiment shown in FIG. 5. For example, the first stability capacitor $C_{s1}$ can be arranged between the node $N_3$ and the gate of the second output transistor $mn_{10}$ or between the node $N_3$ and the gate of the first output transistor mp7. The second stability capacitor $C_{s2}$ can be arranged between the node $N_4$ and the gate of the first output transistor mp7 or between the node $N_4$ and the second output transistor mn10. This or similar arrangements can also provide better stability performance for the amplifier 500.

Figure 6:
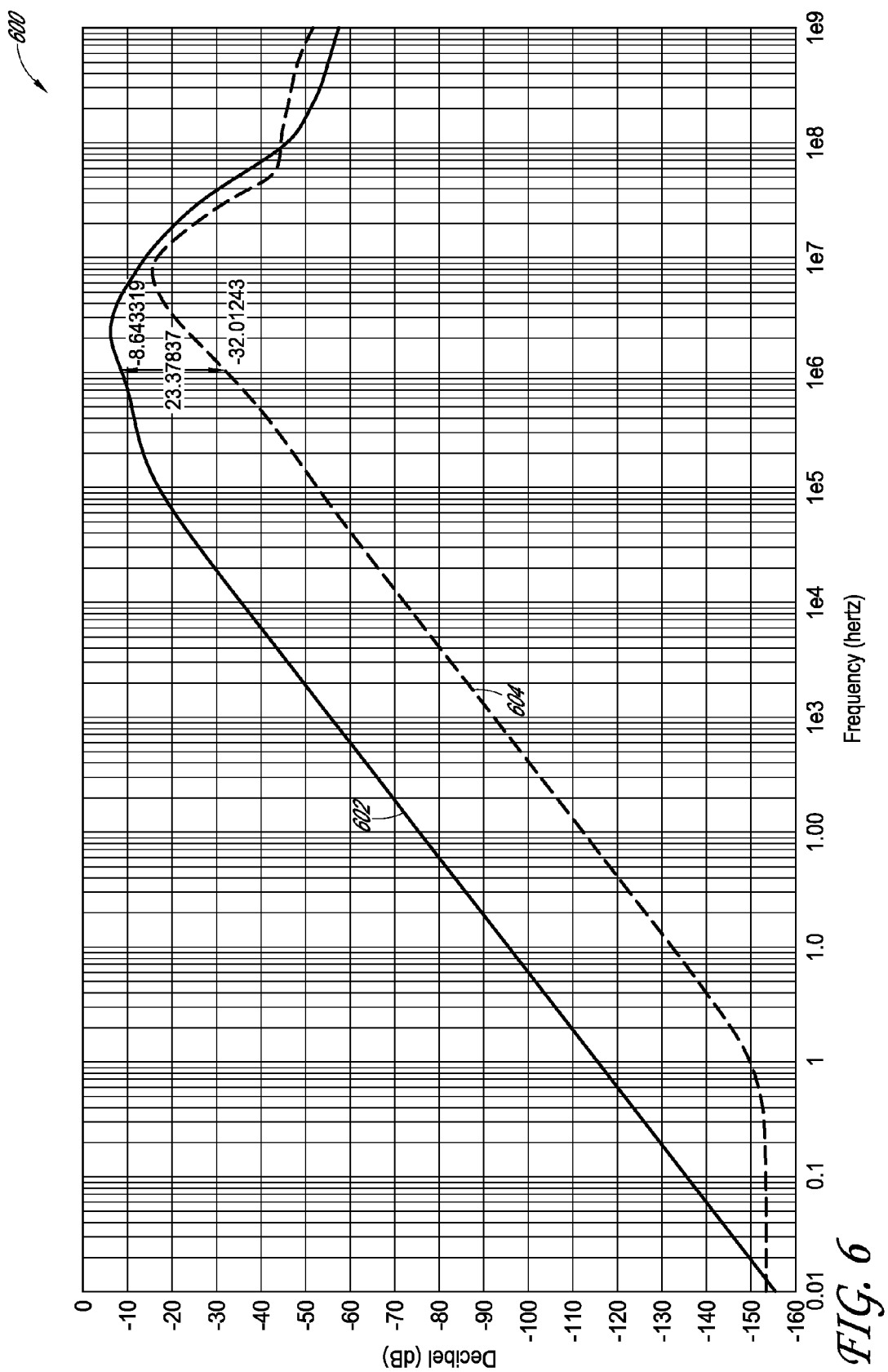
FIG. 6 illustrates a graph of PSRR performance based on device simulations.

FIG. 6 shows a graph 600 of simulation results for two amplifiers. A curve 602 depicts the simulation result for an amplifier in which Miller compensation technique is used without taking advantage of the techniques described above. The curve 604 depicts the simulation result for the same amplifier where Miller compensation is used according to the embodiments described above. The graph 600 depicts power supply rejection ratio (PSRR) performance in decibels (dB) on the y-axis over a range of frequencies in hertz on the x-axis. As can be seen from the graph 600, using the embodiments described above, approximately 23.38 decibel (dB) improvement in PSRR performance of the amplifier at 1 megahertz (MHz) can be observed.

Figure 7A:
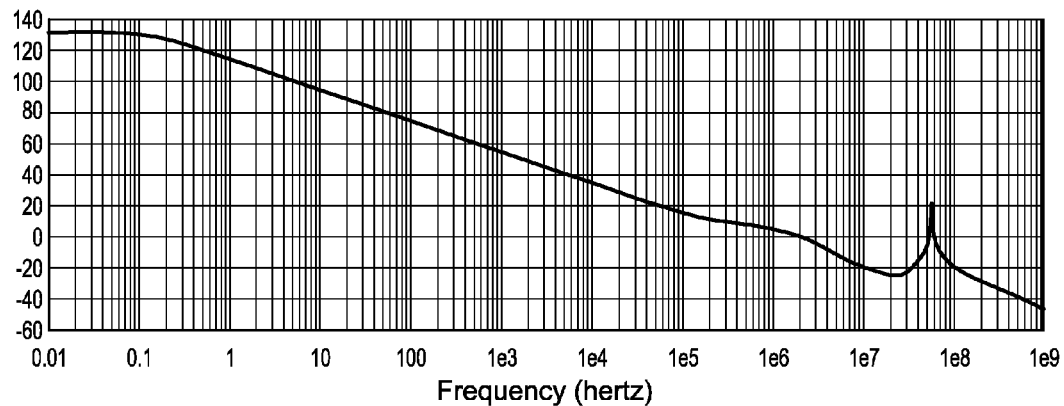
FIGS. 7A and 7B illustrate a Bode plot of magnitude and phase of the frequency response of a device according to an embodiment.
Figure 7B:
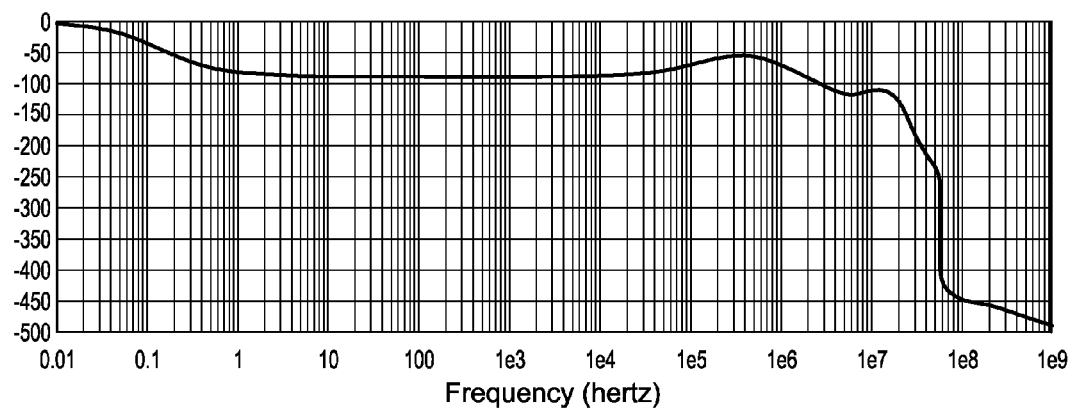

FIGS. 7A and 7B are simulation Bode plots of an amplifier according to an embodiment in which stability capacitors are not used. In FIG. 7A, on the y-axis, the magnitude of the frequency response in dB is depicted. On the x-axis frequency in units of hertz is depicted. In FIG. 7B, on the y-axis, the phase shift in degrees is depicted. On the x-axis, frequency in units of hertz is depicted. As can be seen in FIG. 7A, the gain response exhibits a peak between 10 MHz and 100 MHz which can be undesirable in certain applications.

Figure 8A:
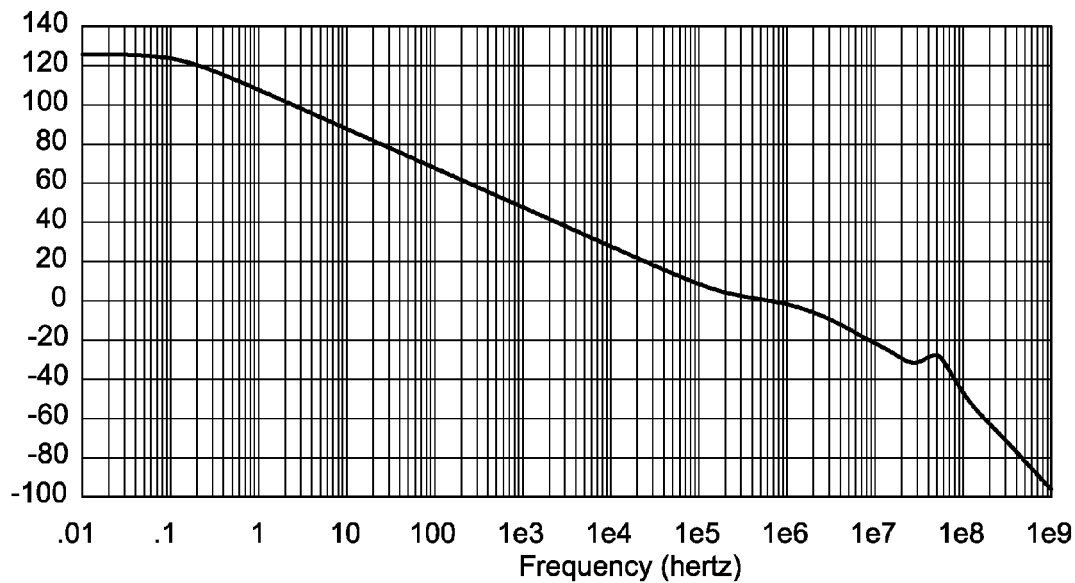
FIGS. 8A and 8B illustrate a Bode plot of magnitude and phase of the frequency response of a device according to another embodiment.
Figure 8B:
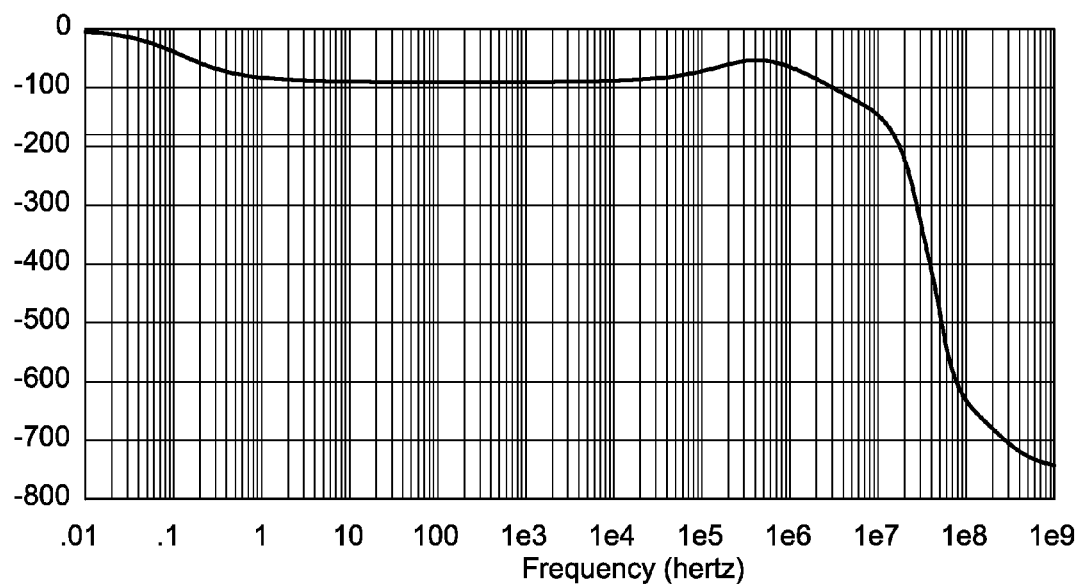

FIGS. 8A and 8B are simulation Bode plots of an amplifier according to an embodiment in which stability capacitors are used to reduce an undesirable peak in the frequency response of the amplifier. In FIG. 8A, on the y-axis, the magnitude of the frequency response in dB is depicted. On the x-axis frequency in units of hertz is depicted. In FIG. 8B, on the y-axis, the phase shift in degrees is depicted. On the x-axis, frequency in units of hertz is depicted. As can be seen in FIG. 8A, the peak in gain between 10 MHz and 100 MHz has been substantially flattened compared to the gain response depicted in FIG. 7A.

Figure 9A:
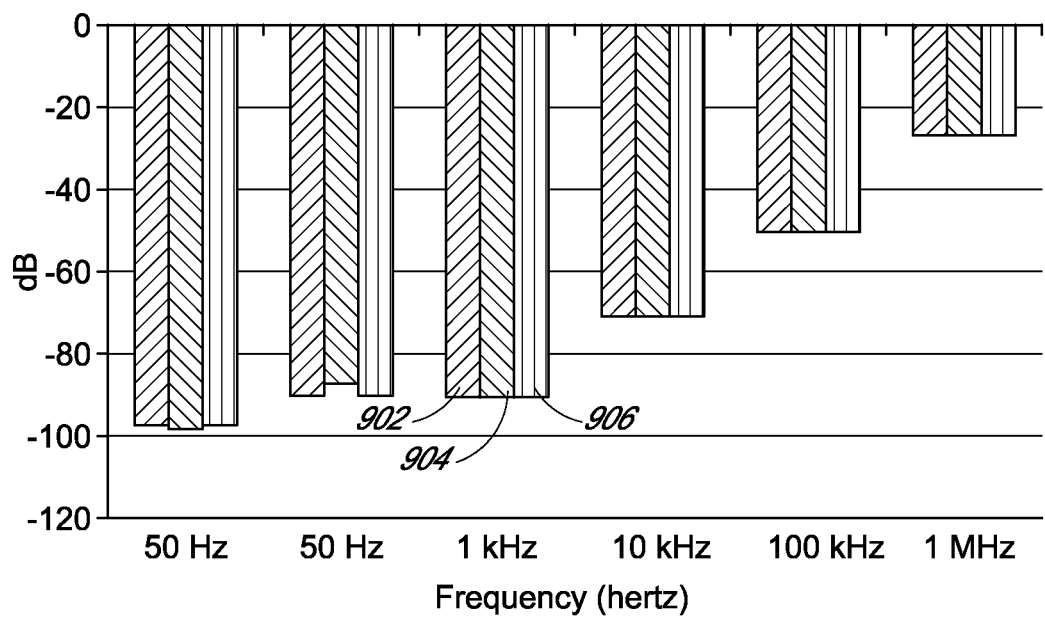
FIGS. 9A and 9B illustrate a graph of PSRR performance based on test devices built according to embodiments described herein.
Figure 9B:
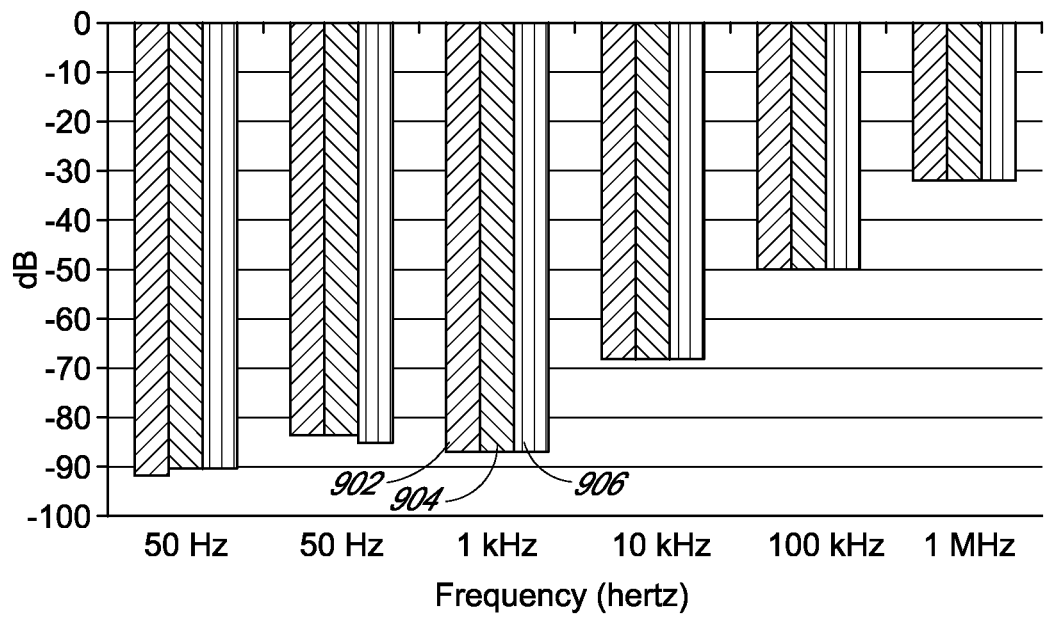

FIGS. 9A and 9B are graphs of PSRR performance for amplifiers built on test chip according to the embodiments described above. FIG. 9A shows the PSRR performance of the device for the positive power supply rail avdd. FIG. 9B shows the PSRR performance of the device for the negative power supply rail ayss. On the y-axis, the PSRR performance is depicted in dB. On the x-axis, a range of frequencies of power supply ripples are depicted in hertz. The regions 902, 904 and 906 each correspond to different fabrication technologies in which the embodiments described above were implemented and tested at different ripple frequencies. As can be seen from FIG. 9A, a PSRR performance of approximately −23 dB at 1 MHz for the positive power supply rail avdd can be achieved. While not shown, such PSRR performance is achieved notably without introducing additional offset, noise or power consumption from additional current sources.

Similarly, as can be seen from FIG. 9B, a PSRR performance of approximately −32 dB at 1 MHz for the negative power supply rail ayss can be achieved. While not shown, such PSRR performance is achieved notably without introducing additional offset, noise or power consumption from additional current sources.

Embodiments described herein have wide applicability. They can, for example, be used anywhere an amplifier is used. For example, embodiments described above can be implemented in an amplifier of a digital to analog converter (DAC) to drive a load. The load can include for example, resistive loads, capacitive loads or other loads. Although the examples provided in this disclosure are described in the context of MOS devices, bipolar or other devices can alternatively be used.

The field-effect transistors (FETs) or "transistors" described herein can correspond to transistors known as metal-oxide-semiconductor field-effect transistors (MOSFETs). While the terms "metal" and "oxide" are present in the name of the device, it will be understood that these transistors can have gates made out of materials other than metals, such as polycrystalline silicon, and can have dielectric "oxide" regions made from dielectrics other than silicon oxide, such as from silicon nitride or high-k dielectrics.

What is claimed is:

1. An apparatus comprising:
a first output transistor of an amplifier, wherein the first output transistor is electrically coupled to an output node;
an amplifier compensation circuit comprising a compensation capacitor and an isolating transistor, wherein:
the compensation capacitor has a first end and a second end, wherein the first end is electrically coupled to the output node, wherein the second end is electrically coupled to a first node;
a source and a drain of the isolating transistor are in a conductive path between the first node and a gate of the first output transistor; and
a biasing transistor in series with the isolating transistor, wherein the biasing transistor is configured to bias the isolating transistor, wherein the biasing transistor is part of a current mirror load of a first stage of the amplifier;
wherein the isolating transistor is biased by diverting a first current from the first stage of the amplifier and returning the first current to the first stage of the amplifier.

2. The apparatus of claim 1 wherein the amplifier compensation circuit further comprises a second compensation capacitor and a second isolating transistor, wherein:
the second compensation capacitor has a first end and a second end, wherein the first end of the second compensation capacitor is electrically coupled to the output node, wherein the second end of the second compensation capacitor is electrically coupled to a second node;
a source and a drain of the second isolating transistor are in a conductive path between the second node and a gate of a second output transistor; and
a second biasing transistor in series with the second isolating transistor, wherein the second biasing transistor is configured to bias the second isolating transistor, wherein the second biasing transistor is part of a second current mirror load of the first stage of the amplifier;
wherein the second isolating transistor is biased by diverting a second current from the first stage of the amplifier and returning the second current to the first stage of the amplifier.

3. The apparatus of claim 2 further comprising a voltage source circuit configured to bias the gates of the first and second isolating transistors with a reference voltage that is substantially invariable to voltage fluctuations of a power supply of the amplifier.

4. The apparatus of claim 2 wherein the biasing transistor is part of a current mirror load of the first stage of the amplifier such that a size ratio of the biasing transistor, a first transistor of the current mirror load and a second transistor of the current mirror load is about 2 to 3 to 5 respectively.

5. The apparatus of claim 2 wherein the second biasing transistor is part of a second current mirror load of the first stage of the amplifier such that a size ratio of the second biasing transistor, a first transistor of the second current mirror load and a second transistor of the second current mirror load is about 2 to 3 to 5 respectively.

6. The apparatus of claim 2 further comprising:
first and second stability capacitors, wherein:
the first stability capacitor has a first end and a second end, wherein the first end of the first stability capacitor is electrically coupled to the first node and the second end of the first stability capacitor is electrically coupled to a source of the first biasing transistor; and
the second stability capacitor has a first end and a second end, wherein the first end of the second stability capacitor is electrically coupled to the second node and the second end of the second stability capacitor is electrically coupled to a source of the second biasing transistor.

7. The apparatus of claim 2 further comprising:
first and second stability capacitors, wherein:
the first stability capacitor has a first end and a second end, wherein the first end of the first stability capacitor is electrically coupled to the first node and the second end of the first stability capacitor is electrically coupled to the gate of the first or the second output transistor; and
the second stability capacitor has a first end and a second end, wherein the first end of the second stability capacitor is electrically coupled to the second node and the second end of the second stability capacitor is electrically coupled to the gate of the first or the second output transistor.

8. The apparatus of claim 2 wherein the amplifier comprises a class AB amplifier.

9. The apparatus of claim 8 further comprising a class AB control circuit wherein: the control circuit comprises a first control transistor and a second control transistor.

10. An electrically implemented method of amplifier compensation, the method comprising:
electrically coupling a first output transistor of an amplifier, to an output node;
electrically coupling a first end of a compensation capacitor to the output node, and electrically coupling a second end of the compensation capacitor to a first node;
electrically coupling a source and a drain of an isolating transistor in a conductive path between the first node and a gate of the first output transistor;
biasing the isolating transistor with a biasing transistor in series with the isolating transistor;
mirroring a current from a current mirror load of a first stage of the amplifier to the biasing transistor; and
diverting a first current from the first stage of the amplifier and returning the first current to the first stage of the amplifier.

11. The method of claim 10 further comprising:
electrically coupling a first end of a second compensation capacitor to the output node, and electrically coupling a second end of the second compensation capacitor to a second node;
electrically coupling a source and a drain of a second isolating transistor in a conductive path between the second node and a gate of a second output transistor;
biasing the second isolating transistor with a second biasing transistor in series with the second isolating transistor;
mirroring a second current from a second current mirror load of the first stage of the amplifier to the second biasing transistor; and
diverting a second current from the first stage of the amplifier and returning the second current to the first stage of the amplifier.

12. The method of claim 11 further comprising: biasing, with a voltage source circuit, the gates of the first and second isolating transistors with a reference voltage that is substantially invariable to voltage fluctuations of a power supply of the amplifier.

13. The method of claim 11 wherein the biasing transistor is part of a current mirror load of the first stage of the amplifier such that a size ratio of the biasing transistor, a first transistor of the current mirror load and a second transistor of the current mirror load is about 2 to 3 to 5 respectively.

14. The method of claim 11 wherein the second biasing transistor is part of a second current mirror load of the first stage of the amplifier such that a size ratio of the second biasing transistor, a first transistor of the second current mirror load and a second transistor of the second current mirror load is about 2 to 3 to 5 respectively.

15. The method of claim 11 further comprising:
providing first and second stability capacitors,
electrically coupling a first end of the first stability capacitor to the first node, and electrically coupling a second end of the first stability capacitor to a source of the biasing transistor; and
electrically coupling a first end of the second stability capacitor to the second node, and electrically coupling a second end of the second stability capacitor to a source of the second biasing transistor.

16. The method of claim 11 further comprising: providing first and second stability capacitors,
electrically coupling a first end of the first stability capacitor to the first node, and electrically coupling a second end of the first stability capacitor to the gate of the first or the second output transistor or mp7; and
electrically coupling a first end of the second stability capacitor to the second node, and electrically coupling a second end of the second stability capacitor to the gate of the first or the second output transistor.

17. The method of claim 11 wherein: the amplifier comprises a class AB amplifier.

18. The method of claim 17 wherein: the amplifier further comprises a class AB control circuit, wherein the control circuit comprises: a first control transistor and a second control transistor.

19. An apparatus comprising:
means for outputting an output of an amplifier to an output node;
means for compensation, wherein a first end of the compensation means is configured to be electrically coupled to the output node, and a second end of the compensation means is configured to be electrically coupled to a first node;
means for isolating the output node, wherein the isolating means is in a conductive path between the first node and a gate terminal of the outputting means;
means for biasing the isolating means, wherein the biasing means is in series with the isolating means;
means for mirroring a first current to the biasing means; and
means for diverting the first current from a first stage of the amplifier and returning the first current to the first stage of the amplifier.

20. The apparatus of claim 19 further comprising:
second means for outputting the output of the amplifier to the output node;
second means for compensation, wherein a first end of the second compensation means is configured to be electrically coupled to the output node, and a second end of the second compensation means is configured to be electrically coupled to a second node;
second means for isolating the output node, wherein the second isolating means is in a conductive path between the second node and a gate terminal of the second outputting means;
second means for biasing the second isolating means in series with the second isolating means;
second means for mirroring a second current to the second biasing means; and
means for diverting the second current from a first stage of the amplifier and returning the second current to the first stage of the amplifier.

* * * * *